(12) United States Patent
Hamaguchi et al.

(10) Patent No.: US 9,153,502 B2
(45) Date of Patent: Oct. 6, 2015

(54) SEMICONDUCTOR CHIP TESTING METHOD AND SEMICONDUCTOR CHIP TESTING DEVICE

(75) Inventors: Takuya Hamaguchi, Tokyo (JP); Tetsujiro Tsunoda, Tokyo (JP); Shoko Kanazawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 549 days.

(21) Appl. No.: 13/494,553

(22) Filed: Jun. 12, 2012

(65) Prior Publication Data

US 2013/0080088 A1    Mar. 28, 2013

(30) Foreign Application Priority Data

Sep. 26, 2011 (JP) ................................. 2011-209160

(51) Int. Cl.
| | |
|---|---|
| *G01R 31/26* | (2014.01) |
| *H01L 21/66* | (2006.01) |
| *G01R 31/28* | (2006.01) |

(52) U.S. Cl.
CPC ............. *H01L 22/14* (2013.01); *H01L 22/20* (2013.01); *G01R 31/2894* (2013.01)

(58) Field of Classification Search
CPC .... H01L 22/14; H01L 22/20; G01R 31/2894; G01R 31/31718
USPC ................ 702/58, 81–84, 117, 118; 700/121
See application file for complete search history.

(56) References Cited

U.S. PATENT DOCUMENTS

| 6,133,052 | A  | * | 10/2000 | Ichihara ............................ 438/7 |
|---|---|---|---|---|
| 2005/0043903 | A1 | * | 2/2005 | Nara et al. ...................... 702/35 |
| 2008/0038098 | A1 | | 2/2008 | Ito et al. |

(Continued)

FOREIGN PATENT DOCUMENTS

| JP | 8-86833 | 4/1996 |
|---|---|---|
| JP | 8-97258 | 4/1996 |
| JP | 2004-47542 | 2/2004 |

(Continued)

OTHER PUBLICATIONS

Office Action issued Jul. 16, 2013 in Korean Patent Application No. 10-2012-0102636 (with partial English language translation).

(Continued)

*Primary Examiner* — Manuel L Barbee
(74) *Attorney, Agent, or Firm* — Oblon, McClelland, Maier & Neustadt, L.L.P.

(57) ABSTRACT

A semiconductor chip testing method includes: (a) testing the electrical characteristics of each of semiconductor chips in the form of wafers or in the form of chips formed on a predetermined number of semiconductor wafers having certain relationship, and determining if the semiconductor chip is non-defective or defective; (b) calculating a percentage of semiconductor chips determined to be defective as a fraction defective for each of wafer addresses based on determination results about the semiconductor chips on the predetermined number of semiconductor wafers, the wafer addresses indicating the respective positions of the semiconductor chips on the semiconductor wafers; and (c) changing a determination result about a semiconductor chip determined to be non-defective to defective, the semiconductor chip being at a wafer address determined to have a fraction defective at a threshold or higher than the threshold.

20 Claims, 10 Drawing Sheets

(56) References Cited

U.S. PATENT DOCUMENTS

| | | |
|---|---|---|
| 2008/0042667 A1 | 2/2008 | Yamashita et al. |
| 2010/0148793 A1 | 6/2010 | Ito et al. |

FOREIGN PATENT DOCUMENTS

| | | | |
|---|---|---|---|
| JP | 2006-100352 | | 4/2006 |
| JP | 2007-095953 A | | 4/2007 |
| JP | 2007095953 A | * | 4/2007 |
| JP | 2009-105210 | | 5/2009 |
| JP | 2009105210 A | * | 5/2009 |
| JP | 2010-156709 | | 7/2010 |

OTHER PUBLICATIONS

Japanese Office Action issued Jun. 24, 2014, in Japan Patent Application No. 2011-209160 (with English translation).

* cited by examiner

STORE INTO CASSETTE

SEMICONDUCTOR CHIP TESTING METHOD AND SEMICONDUCTOR CHIP TESTING DEVICE

BACKGROUND OF THE INVENTION

1. Field of the Invention

The present invention relates to a semiconductor chip testing method and a semiconductor chip testing device required to provide high reliability.

2. Description of the Background Art

A conventional semiconductor chip testing device used to test a plurality of semiconductor chips on a semiconductor wafer determines if various electrical characteristics of the semiconductor chips are non-defective or defective according to a range of specifications required in terms of application (see Japanese Patent Application Laid-Open No. 8-86833 (1996), for example).

If there is a crystal defect in a semiconductor wafer (hereinafter also called a wafer) or if there is an abnormality in a processing device for manufacturing semiconductor, electrical characteristics are easily determined to be defective in a particular position on the wafer. If a defect generated in such a particular position is a tiny defect and cannot be detected in terms of electrical characteristics of a semiconductor chip, the conventional semiconductor chip testing device determines that this semiconductor chip is non-defective. This results in a problem in that the conventional semiconductor chip testing device in fact has allowed shipment of a semiconductor chip (hereinafter also called a chip) with a defect.

SUMMARY OF THE INVENTION

It is an object of the present invention to provide a semiconductor chip testing method and a semiconductor chip testing device of high reliability.

According to the semiconductor chip testing method of the present invention, the method includes: (a) testing the electrical characteristics of each of semiconductor chips in the form of wafers or in the form of chips formed on a predetermined number of semiconductor wafers having certain relationship, and determining if the semiconductor chip is non-defective or defective; (b) calculating a percentage of semiconductor chips determined to be defective as a fraction defective for each of wafer addresses based on determination results about the semiconductor chips on the predetermined number of semiconductor wafers, the wafer addresses indicating the respective positions of the semiconductor chips on the semiconductor wafers; and (c) changing a determination result about a semiconductor chip determined to be non-defective to defective, the semiconductor chip being at a wafer address determined to have a fraction defective at a threshold or higher than the threshold.

The semiconductor chip testing method of the present invention includes the step (c) of changing a determination result about a semiconductor chip determined to be non-defective to defective, the semiconductor chip being at a wafer address determined to have a fraction defective at the threshold or higher than the threshold. Thus, only a semiconductor chip of high reliability can be determined to be non-defective.

According to the semiconductor chip testing device of the present invention, the device includes a determining part, a fraction defective calculating part, and a determination updating part. The determining part tests the electrical characteristics of each of semiconductor chips in the form of wafers or in the form of chips formed on a predetermined number of semiconductor wafers having certain relationship, and determines if the semiconductor chip is non-defective or defective. The fraction defective calculating part calculates a percentage of semiconductor chips determined to be defective as a fraction defective for each of wafer addresses based on determination results about the semiconductor chips on the predetermined number of semiconductor wafers. The wafer addresses indicate the respective positions of the semiconductor chips on the semiconductor wafers. The determination updating part changes a determination result about a semiconductor chip determined to be non-defective to defective. The semiconductor chip is at a wafer address determined to have a fraction defective at a threshold or higher than the threshold.

In the semiconductor chip testing device of the present invention, the determination updating part changes a determination result about a semiconductor chip determined to be non-defective to defective. The semiconductor chip is at a wafer address determined to have a fraction defective at the threshold or higher than the threshold. Thus, only a semiconductor chip of high reliability can be determined to be non-defective.

These and other objects, features, aspects and advantages of the present invention will become more apparent from the following detailed description of the present invention when taken in conjunction with the accompanying drawings.

EMBODIMENT FOR CARRYING OUT THE INVENTION

First Preferred Embodiment

Structure

Figure 1:
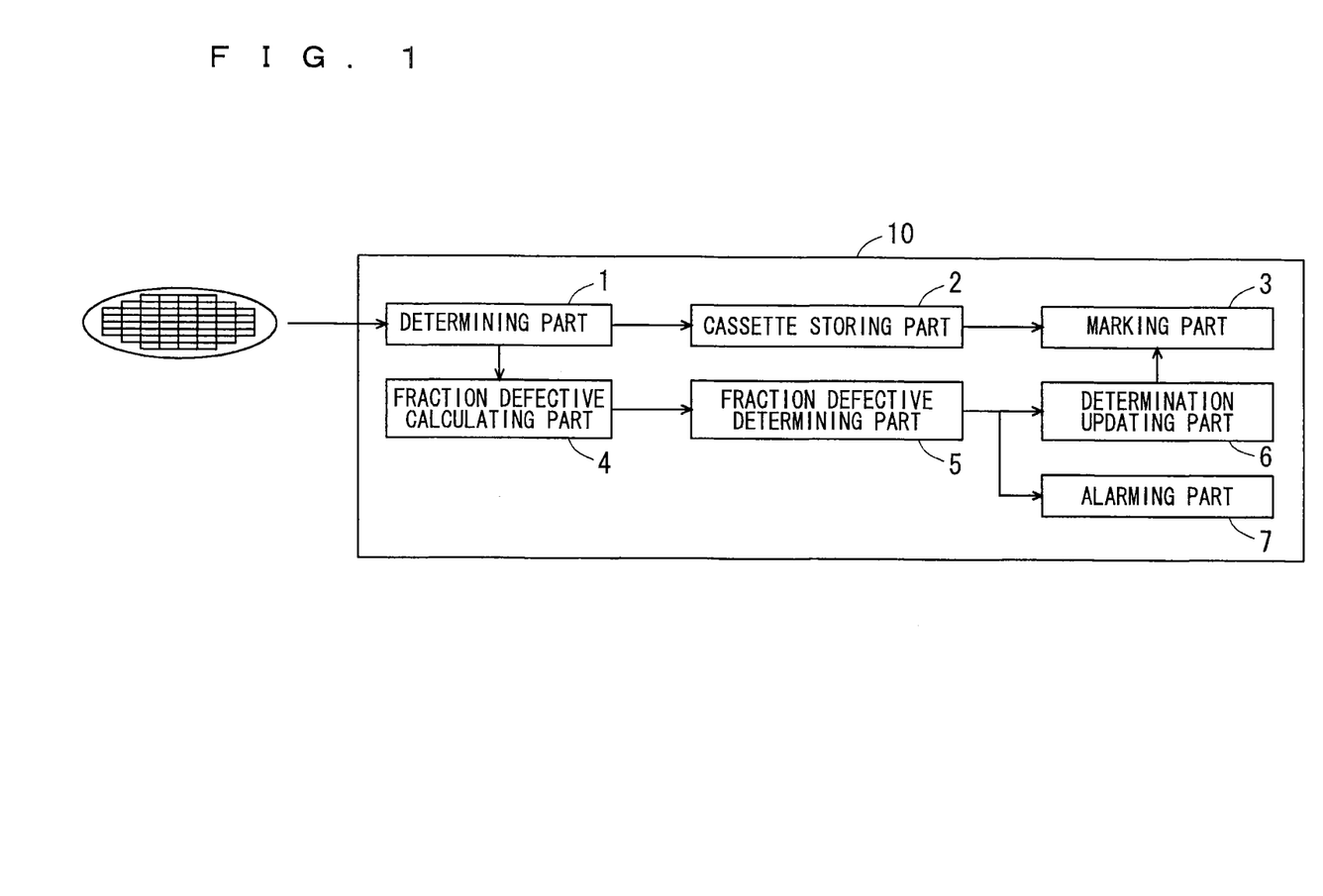
FIG. 1 is a block diagram showing the structure of a semiconductor chip testing device of a first preferred embodiment.

FIG. 1 is a block diagram showing the structure of a semiconductor chip testing device 10 of a first preferred embodiment. The semiconductor chip testing device 10 includes a determining part 1, a cassette storing part 2, a marking part 3, a fraction defective calculating part 4, a fraction defective determining part 5, a determination updating part 6, and an alarming part 7.

The semiconductor chip testing device 10 tests wafers having certain relationship in units of predetermined number of wafers. By way of example, the semiconductor chip testing device 10 tests wafers manufactured in one manufacturing device, or wafers belonging to one ingot. In the below, the predetermined number of wafers are called a wafer group.

The determining part 1 determines if the electrical characteristics of each chip on a wafer are non-defective or defective. Then, the determining part 1 generates determination data containing a determination result about a chip, a wafer address indicating the position of the chip on a wafer, and a wafer number unique to each wafer that are associated with each other, and outputs the determination data to the fraction defective calculating part 4.

Figure 2:
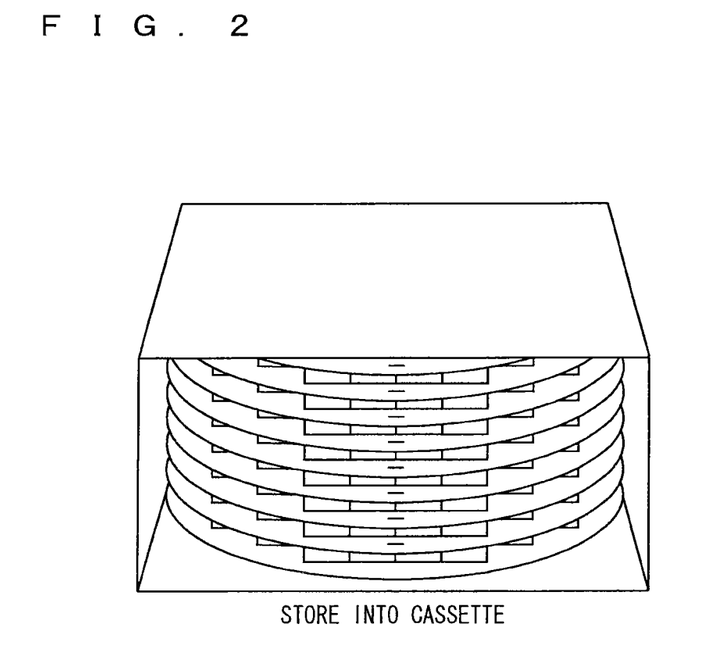
FIG. 2 shows wafers stored in a cassette by a cassette storing part of the first preferred embodiment.

The cassette storing part 2 stores a semiconductor wafer group after being subject to determination by the determining part 1 into a cassette as shown in FIG. 2.

The marking part 3 receives determination data from the determining part 1 and the determination updating part 6 described later, and marks information indicating defectiveness on a chip determined to be defective.

The fraction defective calculating part 4 receives determination data about each chip from the determining part 1. After receiving determination data about all chips in a semiconductor wafer group, the fraction defective calculating part 4 obtains the total number of chips determined to be defective for each wafer address, and calculates a percentage of chips determined to be defective as a fraction defective.

The fraction defective determining part 5 receives a fraction defective of each wafer address from the fraction defective calculating part 4, and determines if the received fraction defective is at a predetermined threshold or higher than the threshold. Then, the fraction defective determining part 5 outputs a result of the determination to the determination updating part 6 and the alarming part 7.

The determination updating part 6 receives determination data about all chips belonging to a wafer group and a determination result about a fraction defective of each wafer address from the fraction defective determining part 5. If there is a wafer address having a fraction defective at the threshold or higher than the threshold, the determination updating part 6 refers to a determination result about a chip belonging to the same semiconductor wafer group and having the same wafer address, and changes a determination result of the chip to defective if this chip is determined to be non-defective.

The alarming part 7 accepts a determination result about a fraction defective of each wafer address from the fraction defective determining part 5. If there is a wafer address having a fraction defective at the threshold or higher than the threshold, the alarming part 7 gives an alarm to the outside of the device. As an example, the alarming part 7 displays a wafer address having a fraction defective at the threshold or higher than the threshold on an interface of the device.

Operation

Figure 3:
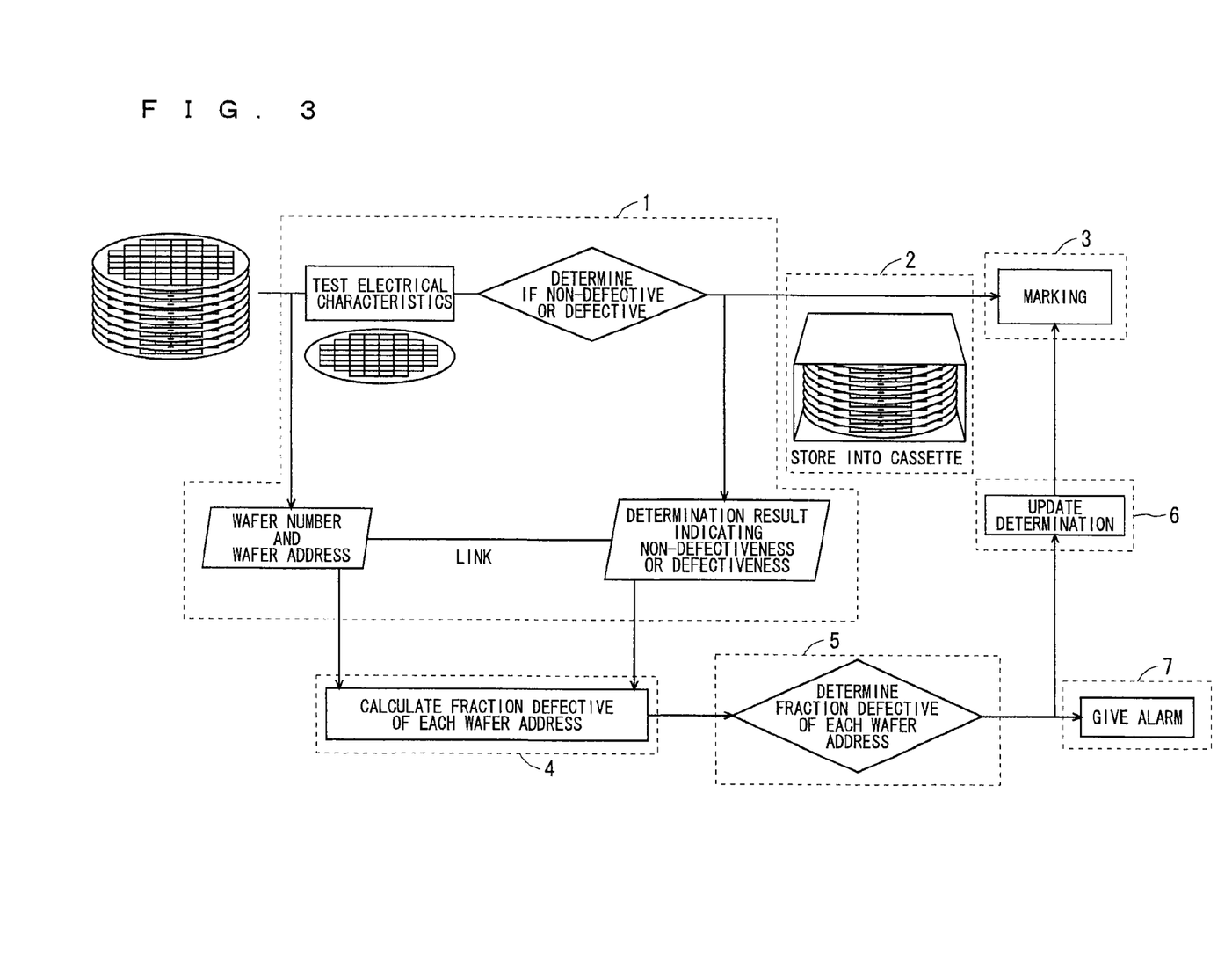
FIG. 3 explains the structure of the semiconductor chip testing device of the first preferred embodiment in consideration of the operation thereof.

FIG. 3 explains the structure of the semiconductor chip testing device 10 of the first preferred embodiment in consideration of the operation thereof. In FIG. 3, dotted frames correspond to the blocks shown in FIG. 1. As an example, a dotted frame with reference number 1 shows process performed by the determining part 1.

Figure 4:
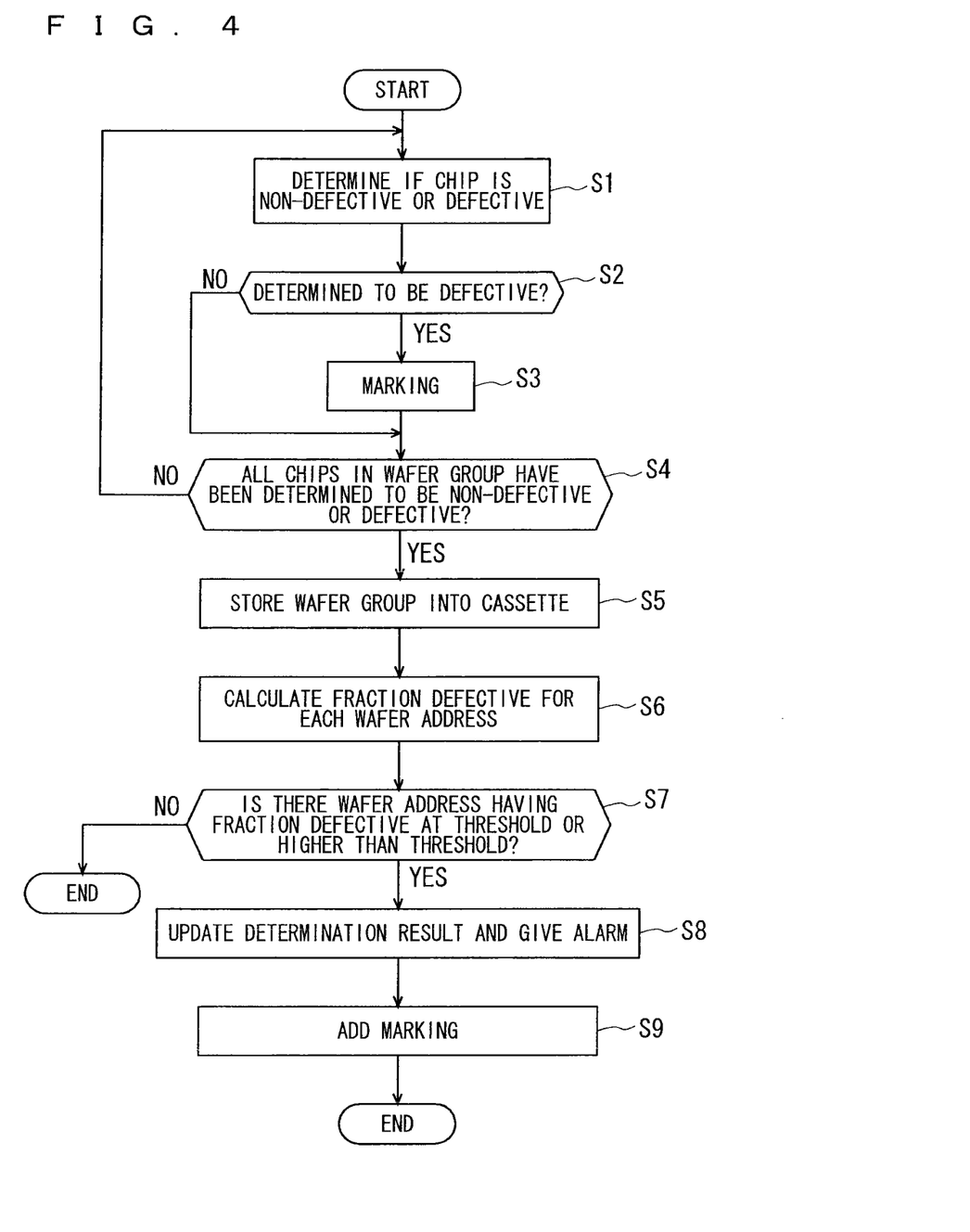
FIG. 4 is a flow diagram showing the operation of the semiconductor chip testing device of the first preferred embodiment.

FIG. 4 is a flow diagram showing the operation of the semiconductor chip testing device 10 of the first preferred embodiment. The operation of the semiconductor chip testing device 10 is described below by referring to FIG. 4.

First, the determining part 1 tests the electrical characteristics of each semiconductor chip on a semiconductor wafer to determine if the tested chip is non-defective or defective (step S1). Determination data about each chip is transmitted from the determining part 1 to the marking part 3. The marking part 3 marks information indicating defectiveness on a chip determined to be defective (steps S2 and S3).

Next, it is determined if the determining part 1 makes determinations about all chips in a wafer group (step S4). If not, the procedure returns to step S1 to make determination about an undetermined chip. When the determining part 1 makes determinations about all the chips in the wafer group, the cassette storing part 2 stores the wafer group into a cassette, and the wafer group is placed on standby waiting for completion of calculation of a fraction defective by the fraction defective calculating part 4 (step S5, see FIG. 2). The cassette storing part 2 generates information about a repository indicating the position of an arbitrary wafer stored in the cassette.

The fraction defective calculating part 4 receives determination data about each chip from the determining part 1. Then, based on determination data about all the chips in the wafer group, the fraction defective calculating part 4 obtains the total number of chips determined to be defective for each wafer address, and calculates a fraction defective (step S6).

Next, the fraction defective determining part 5 determines if the fraction defective calculated in step S6 is at a predetermined threshold or higher than the threshold (step S7). The procedure is finished here if the fraction defectives of all wafer addresses are lower than the threshold. If there is a wafer address having a fraction defective at the threshold or higher than the threshold, the determination updating part 6 receives a determination result about a fraction defective of each wafer address from the fraction defective determining part 5, and receives determination data about all the chips in the wafer group from the fraction defective calculating part 4. If there is a chip determined to be non-defective belonging to the same wafer group and having the wafer address of a fraction defective exceeding the threshold, the determination updating part 6 changes the determination result of this chip to defective (step S8). Namely, the determination updating part 6 rewrites the determination data about this semiconductor chip.

The determination data rewritten in step S8 is transmitted to the marking part 3. In response, the marking part 3 retrieves a wafer to which the chip with the rewritten determination result belongs by referring to the information about a repository in the cassette storing part 2, and marks information on this chip to show that the chip is determined to be defective (step S9).

If a fraction defective is high at a particular wafer address, a chip having this wafer address and determined to be non-defective is considered to have high probability of generation of a tiny defect that cannot be detected in terms of electrical characteristics. So, if chips at this wafer address are all determined to be defective, only a chip of high reliability is left unremoved and can be used for assembly of an element.

The alarming part 7 generates an alarm in parallel with update of a determination result by the determination updating part 6 to notify the wafer address of a fraction defective at the threshold or higher than the threshold to the outside of the device (step S8). As a result, a user of the semiconductor chip testing device 10 is allowed to know that an abnormality is generated at high frequency in the particular wafer address without the need of seeing a determination result about each chip, and is capable of giving feedback to manufacturing process.

Modifications

Figure 5:
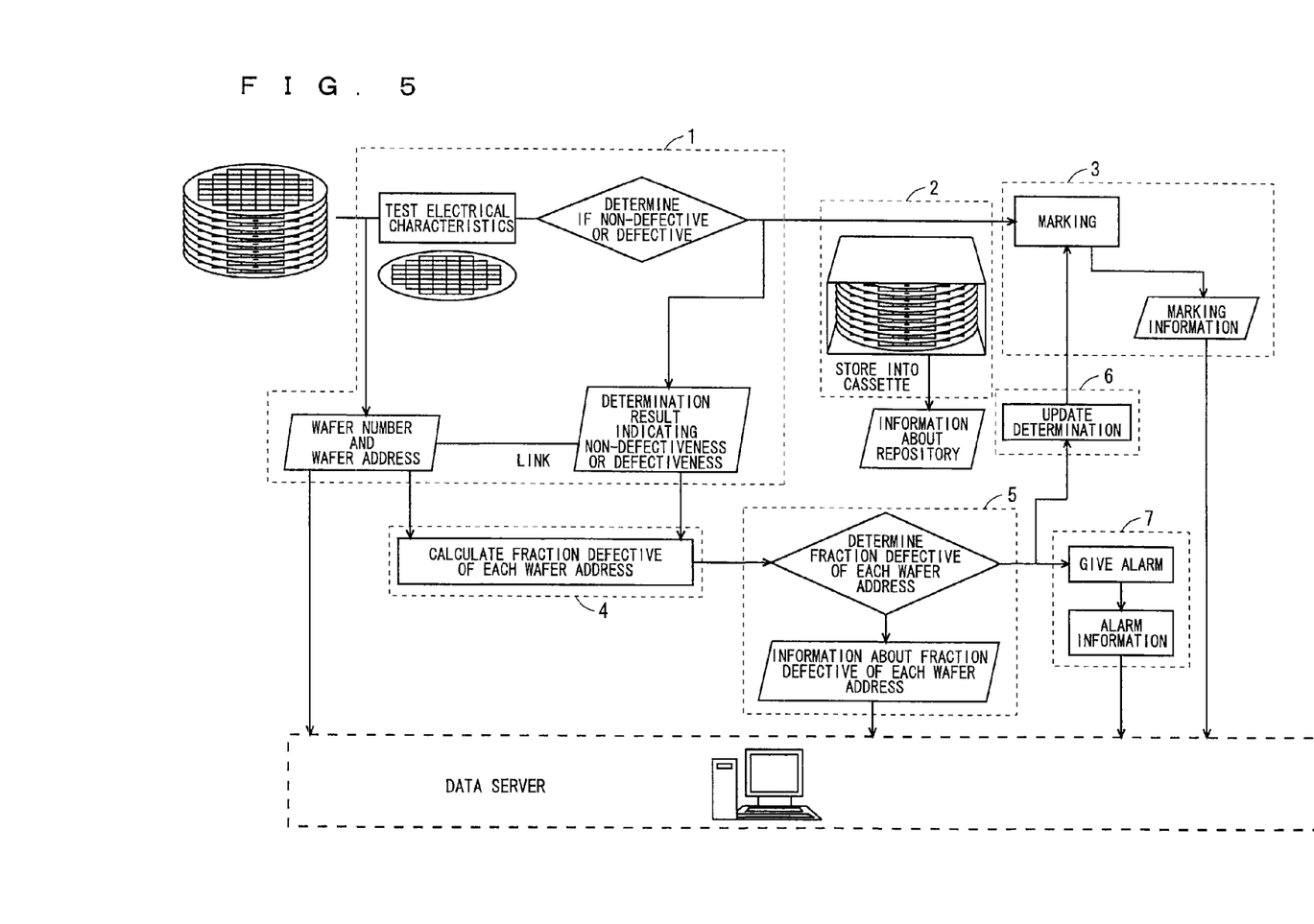
FIG. 5 explains the structure of a semiconductor chip testing device of a modification of the first preferred embodiment in consideration of the operation thereof.

In the description given above, information is transmitted between the components of the semiconductor chip testing device 10. Meanwhile, a data server to manage the information in a centralized manner may be provided, and each of the components may be put into operation by transferring information to and from the data server as shown in FIG. 5. Examples of the information managed in a centralized manner by the data server include a determination result and determination data output from the determining part 1, a fraction defective of each wafer address output from the fraction defective calculating part 4, a determination result about a fraction defective of each wafer address output from the fraction defective determining part 5, marking information corresponding to information indicating a chip marked by the marking part 3, and information about a repository generated by the cassette storing part 2. If these pieces of information are managed in association with each other and in a centralized manner by the data server, data can be managed and extracted easily.

Effects

A semiconductor chip testing method of the first preferred embodiment includes the steps of: (a) testing the electrical characteristics of each of semiconductor chips in the form of wafers or in the form of chips formed on a predetermined number of semiconductor wafers having certain relationship, and determining if the semiconductor chip is non-defective or defective; (b) calculating a percentage of semiconductor chips determined to be defective as a fraction defective for each of wafer addresses based on determination results about the semiconductor chips on the predetermined number of semiconductor wafers, the wafer addresses indicating the respective positions of the semiconductor chips on the semiconductor wafers; and (c) changing a determination result about a semiconductor chip determined to be non-defective to defective, the semiconductor chip being at a wafer address determined to have a fraction defective at a threshold or higher than the threshold. Thus, only a semiconductor chip of high reliability can be determined to be non-defective.

In the semiconductor chip testing method of the first preferred embodiment, the step (a) tests the electrical characteristics of the semiconductor chips on the semiconductor wafers formed in one manufacturing device or belonging to one ingot, and determines if the semiconductor chips are non-defective or defective. Regarding the semiconductor wafers having such relationship, a crystal defect or a defect generated by an abnormality in a manufacturing and processing device is likely to occur at a particular position (wafer address). So, only a semiconductor chip of high reliability can be determined to be non-defective by determining a semiconductor chip to be defective that is at a wafer address having a high fraction defective in the predetermined number of semiconductor wafers.

The semiconductor chip testing method of the first preferred embodiment further includes the step of (d) generating an alarm if any one of the wafer addresses has a fraction defective at the threshold or higher than the threshold. Thus, a user of the method is allowed to know that an abnormality is generated at high frequency in a particular wafer address without the need of seeing a determination result about each chip, and is capable of giving feedback to manufacturing process.

The semiconductor chip testing method of the first preferred embodiment further includes the step of (e) marking information indicating defectiveness on the semiconductor chips determined to be defective in the steps (a) and (c). This makes it possible to use only a semiconductor chip determined to be non-defective for assembly of a semiconductor element by referring to the marking on the semiconductor chip.

The semiconductor chip testing method of the first preferred embodiment further includes a step (f) performed after the step (a). In the step (f), the predetermined number of semiconductor wafers are stored into a cassette if the semiconductor chips are tested in the form of wafers. So, the semiconductor wafers can be placed on standby in the cassette waiting for completion of process such as calculation of a fraction defective of each wafer address.

The semiconductor chip testing device of the first preferred embodiment includes: the determining part 1 for testing the electrical characteristics of each of semiconductor chips in the form of wafers or in the form of chips formed on a predetermined number of semiconductor wafers having certain relationship, and determining if the semiconductor chip is non-defective or defective; the fraction defective calculating part 4 for calculating a percentage of semiconductor chips determined to be defective as a fraction defective for each of wafer addresses based on determination results about the semiconductor chips on the predetermined number of semiconductor wafers, the wafer addresses indicating the respective positions of the semiconductor chips on the semiconductor wafers; and the determination updating part 6 for changing a determination result about a semiconductor chip determined to be non-defective to defective, the semiconductor chip being at a wafer address determined to have a fraction defective at a threshold or higher than the threshold. Thus, only a semiconductor chip of high reliability can be determined to be non-defective.

In the semiconductor chip testing device of the first preferred embodiment, the certain relationship indicates that the semiconductor wafers are formed in one manufacturing device or the semiconductor wafers belong to one ingot. Regarding the semiconductor wafers having such relationship, a crystal defect or a defect generated by an abnormality in a manufacturing and processing device is likely to occur at a particular position (wafer address). So, only a semiconductor chip of high reliability can be determined to be non-defective by determining a semiconductor chip to be defective that is at a wafer address having a high fraction defective in the predetermined number of semiconductor wafers.

The semiconductor chip testing device of the first preferred embodiment further includes the alarming part 7 for generating an alarm if any one of the wafer addresses has a fraction defective at the threshold or higher than the threshold. Thus, a user of the device is allowed to know that an abnormality is generated at high frequency in a particular wafer address without the need of seeing a determination result about each chip, and is capable of giving feedback to manufacturing process.

The semiconductor chip testing device of the first preferred embodiment further includes the marking part 3 for marking information indicating defectiveness on the semiconductor chip determined to be defective by the determining part 1 and on the semiconductor chip with a determination result changed to be defective by the determination updating part 6. Thus, a user of the device is allowed to use only a semiconductor chip determined to be non-defective for assembly of a semiconductor element by referring to the marking on the semiconductor chip.

In the semiconductor chip testing device of the first preferred embodiment, the determining part 1 tests the electrical characteristics of the semiconductor chips in the form of wafers. The semiconductor chip testing device further includes the cassette storing part 2 for storing the semiconductor wafers in units of the predetermined number after the determining part 1 makes determinations about the semiconductor chips. So, the semiconductor wafers can be placed on standby in the cassette waiting for completion of process such as calculation of a fraction defective of each wafer address.

The semiconductor chip testing device of the first preferred embodiment further includes the data server for managing information in a centralized manner in association with each other output from components of the semiconductor chip testing device. Thus, data can be managed and extracted easily.

Second Preferred Embodiment

Structure

Figure 6:
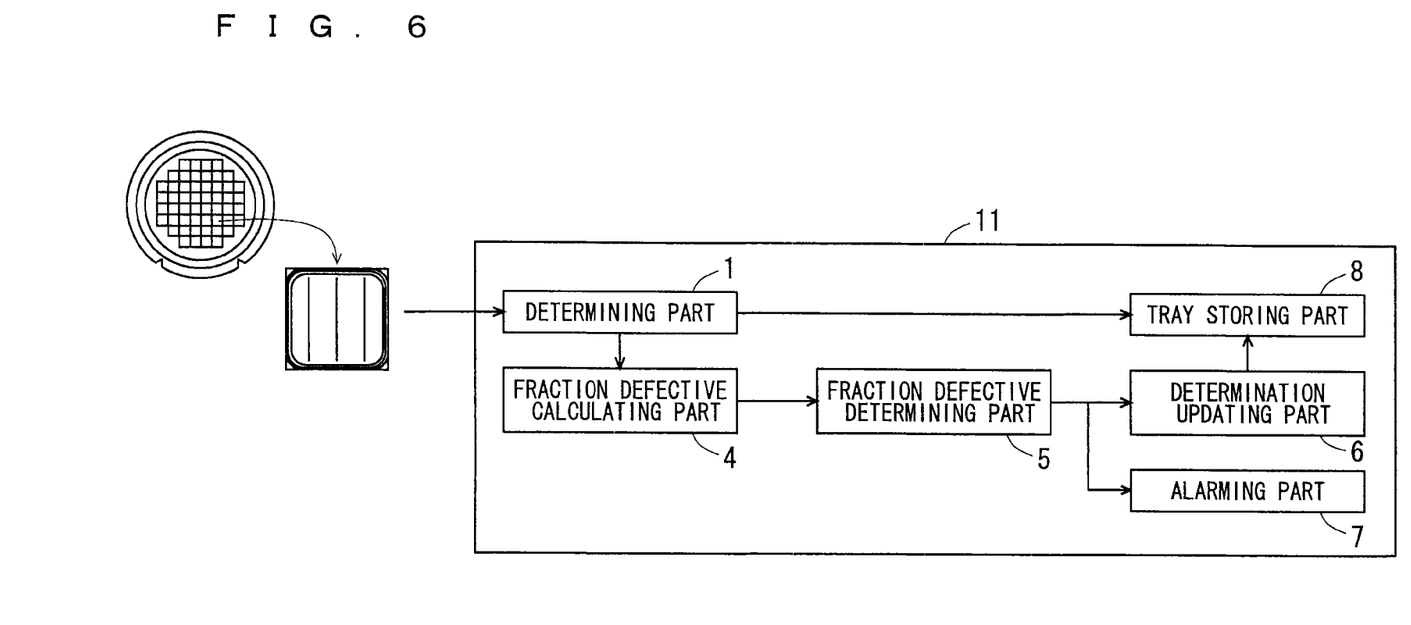
FIG. 6 is a block diagram showing the structure of a semiconductor chip testing device of a second preferred embodiment.

FIG. 6 is a block diagram showing the structure of a semiconductor chip testing device 11 of a second preferred embodiment. In FIG. 6, components being the same as or corresponding to those of the first preferred embodiment are identified by the same reference numbers.

The semiconductor chip testing device 11 differs from the semiconductor chip testing device 10 of the first preferred embodiment in that the semiconductor chip testing device 11 does not include the marking part 3 and the cassette storing part 2, and additionally includes a tray storing part 8. Like the semiconductor chip testing device 10 of the first preferred embodiment, the semiconductor chip testing device 11 tests semiconductor wafers (group of semiconductor waters) in units of a predetermined number of wafers manufactured in one manufacturing device, or wafers belonging to one ingot. The semiconductor chip testing device 11 differs from the semiconductor chip testing device 10 of the first preferred embodiment in that the semiconductor chip testing device 11 tests the electrical characteristics by using a diced semiconductor wafer in the form of a chip.

A determining part 1 samples a chip from a diced wafer, tests the electrical characteristics of the chip, and determines if the chip is non-defective or defective. Then, the determining part 1 generates determination data containing a determination result, a wafer address and a wafer number associated with each other, and outputs the determination data to a fraction defective calculating part 4.

The fraction defective calculating part 4, a fraction defective determining part 5, an alarming part 7, and a determination updating part 6 are the same as those of the first preferred embodiment, so that they will not be described again.

The tray storing part 8 stores a semiconductor chip after being subjected to determination by the determining part 1 into a tray given a tray ID.

Operation

Figure 7:
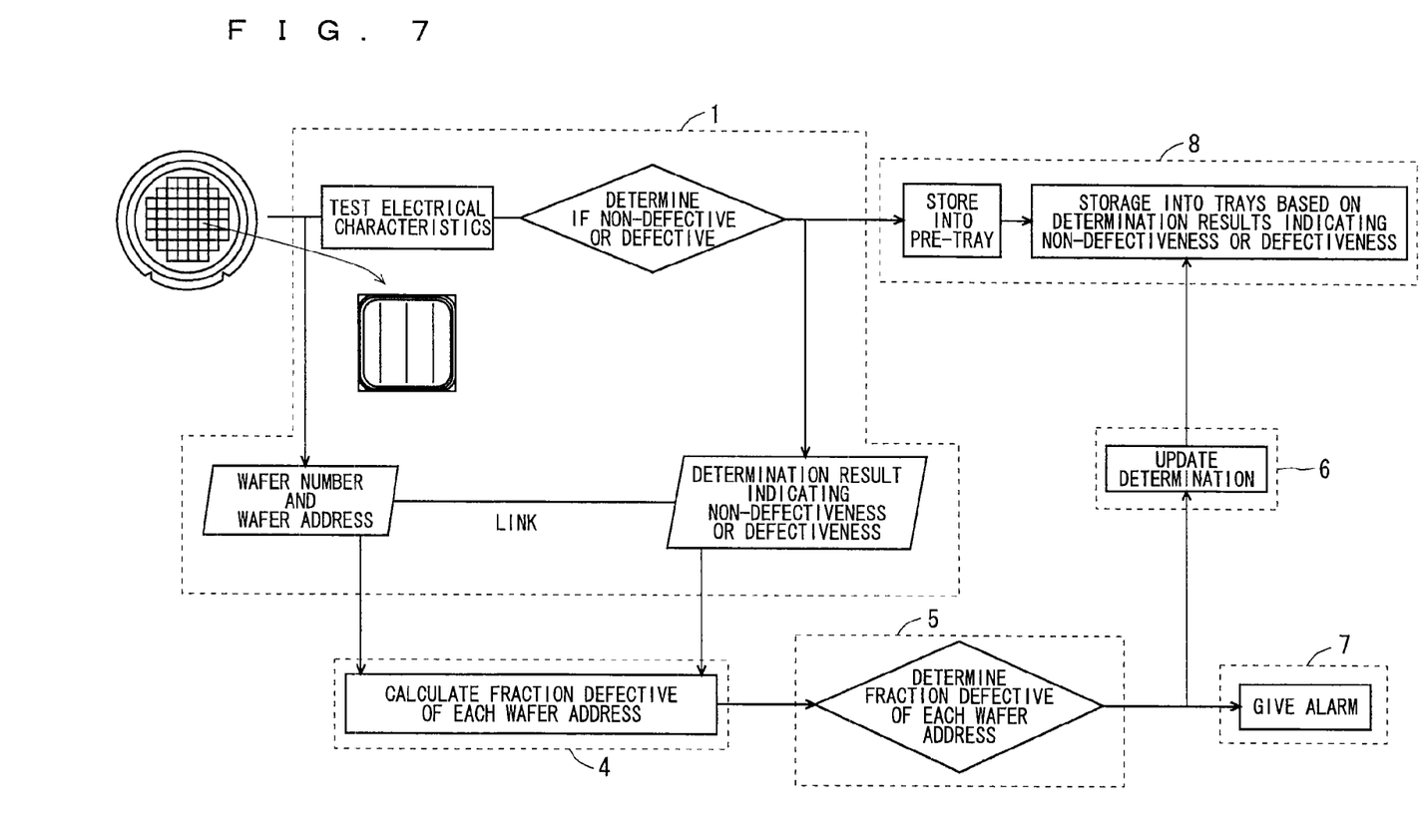
FIG. 7 explains the structure of the semiconductor chip testing device of the second preferred embodiment in consideration of the operation thereof.

FIG. 7 explains the structure of the semiconductor chip testing device 11 of the second preferred embodiment in consideration of the operation thereof. In FIG. 7, dotted frames correspond to the blocks shown in FIG. 6. As an example, a dotted frame with reference number 1 shows process performed by the determining part 1.

Figure 8:
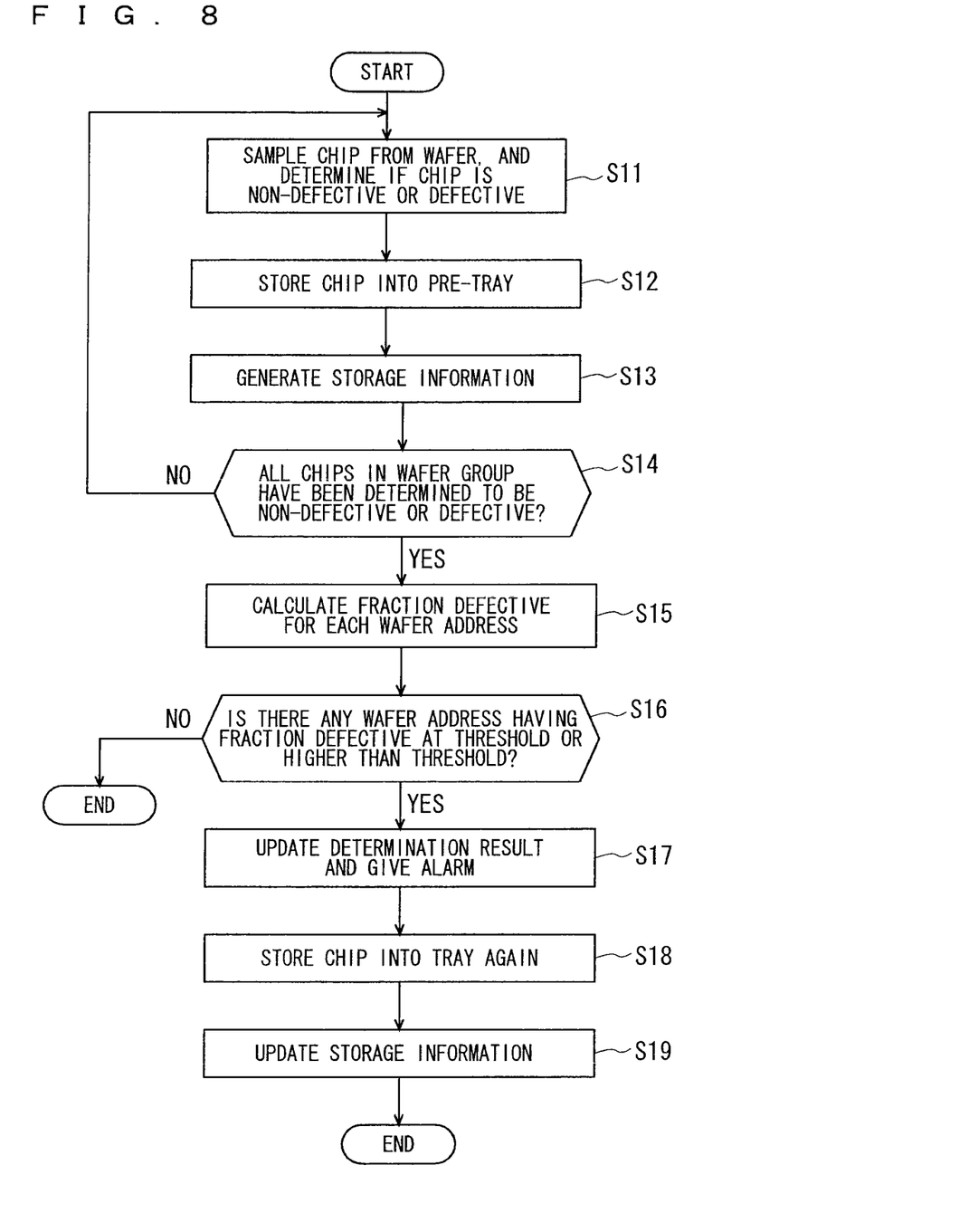
FIG. 8 is a flow diagram showing the operation of the semiconductor chip testing device of the second preferred embodiment.

FIG. 8 is a flow diagram showing the operation of the semiconductor chip testing device 11 of the second preferred embodiment. The operation of the semiconductor chip testing device 11 is described below by referring to FIG. 8.

First, the determining part 1 retrieves chips from a diced wafer, tests the electrical characteristics of the chips, and determines if the chips are non-defective or defective (step S11). The chips determined to be non-defective or defective are sequentially stored in a pre-tray (see FIG. 9) by the tray storing part 8 (step S12).

The pre-tray is given a tray ID. The tray storing part 8 generates and manages storage information about an arbitrary semiconductor chip. The storage information contains determination data about the semiconductor chip, a tray ID of a tray in which the semiconductor chip is stored, and location information indicating the position of the semiconductor chip stored in the tray that are associated with each other (step S13). This makes it possible to know information unique to a semiconductor chip in the tray without the need of directly writing information into the chip.

Next, it is determined if the determining part 1 makes determinations about all chips in a wafer group (step S14). If not, the procedure returns to step S11 to make determination about an undetermined chip. When the determining part 1 makes determinations about all the chips in the wafer group, the fraction defective calculating part 4 calculates a fraction defective of each wafer address.

The fraction defective calculating part 4 always receives a determination result about a chip, and a wafer address and a wafer number associated with the determination result from the determining part 1. The fraction defective calculating part 4 obtains the total number of chips determined to be defective for each wafer address based on these pieces of information about all the chips in the wafer group, and calculates a fraction defective (step S15).

Next, the fraction defective determining part 5 determines if the fraction defective calculated in step S15 is at a predetermined threshold or higher than the threshold (step S16). The procedure is finished here if the fraction defectives of all wafer addresses are lower than the threshold. If there is a wafer address having a fraction defective at the threshold or higher than the threshold, the determination updating part 6 receives a determination result about a fraction defective of each wafer address from the fraction defective determining part 5, and receives determination data about all the semiconductor chips in the wafer group from the fraction defective calculating part 4. If there is a chip determined to be non-defective belonging to the same wafer group and having the wafer address of a fraction defective exceeding the threshold, the determination updating part 6 changes the determination result of this semiconductor chip to defective (step S17). Namely, the determination updating part 6 rewrites the determination data about this chip.

Figure 9:
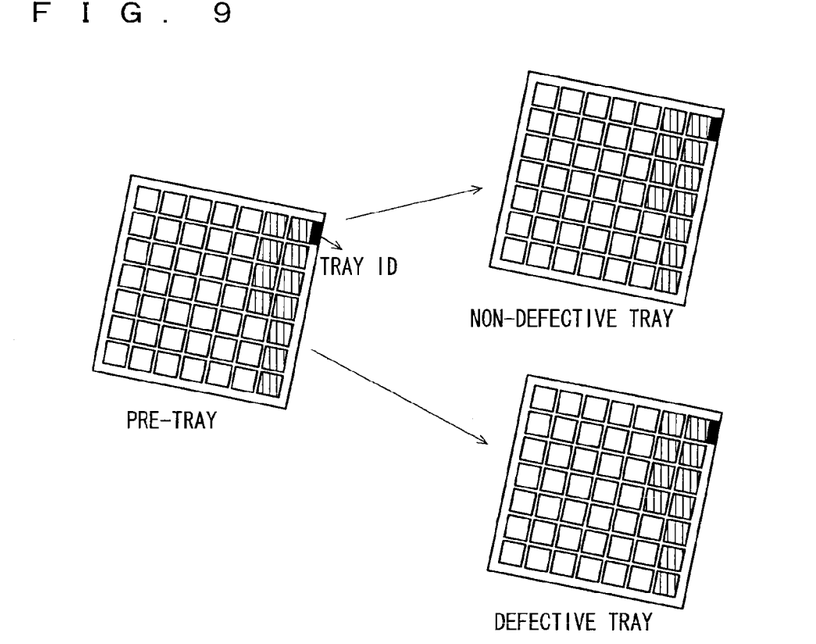
FIG. 9 shows a pre-tray, a non-defective tray, and a defective tray of the second preferred embodiment.

Then, the tray storing part 8 stores the chips into a tray again (step S18). The tray storing part 8 receives determination data about all the chips in the wafer group from the determining part 1, and further, the updated determination data from the determination updating part 6. So, based on these pieces of determination data and by referring to the storage information, the tray storing part 8 stores chips determined to be non-defective into a non-defective tray, and stores chips determined to be defective into a defective tray as shown in FIG. 9. Storing semiconductor chips in this way according to the determination results thereof makes it possible to use only a semiconductor chip of high reliability determined to be non-defective for assembly of a semiconductor element.

Next, the tray storing part 8 updates the storage information (step S19).

The alarming part 7 generates an alarm in parallel with update of a determination result by the determination updating part 6 to notify the wafer address of a fraction defective at the threshold or higher than the threshold to the outside of the device (step S17). As a result, a user of the semiconductor chip testing device 11 is allowed to know that an abnormality is generated at high frequency in a particular wafer address without the need of seeing a determination result about each chip, and is capable of giving feedback to manufacturing process.

Modifications

Figure 10:
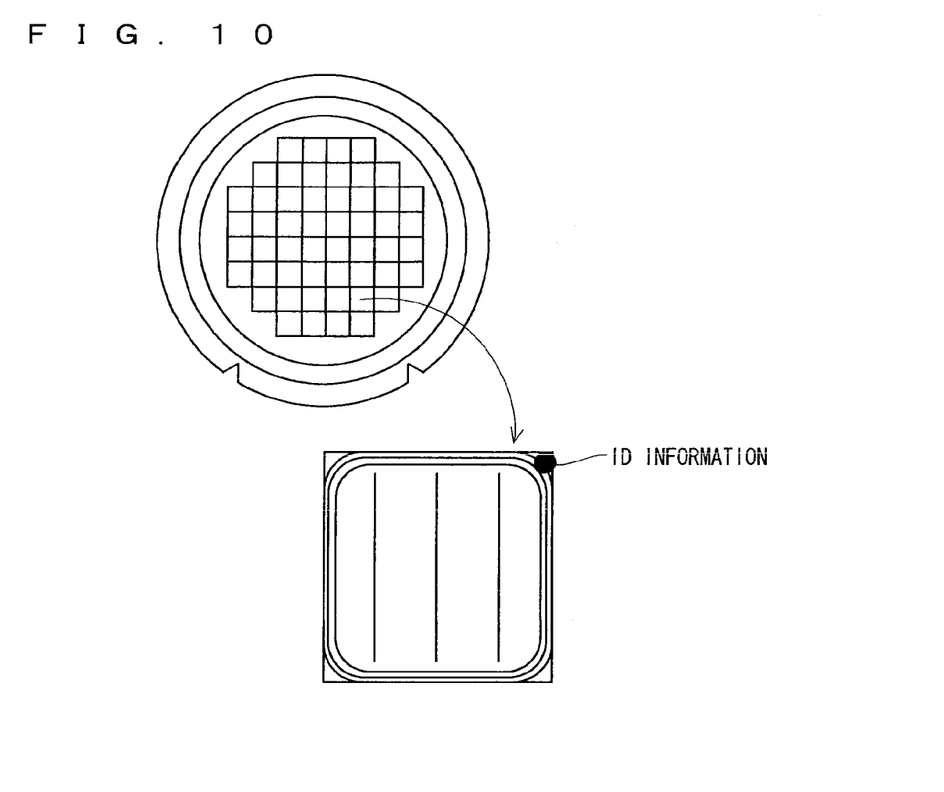
FIG. 10 shows semiconductor chips of a modification of the second preferred embodiment.

As shown in FIG. 10, ID information containing a wafer address and being readable on a semiconductor chip may be written in advance on the semiconductor chip. This makes it possible to search for a semiconductor chip having a desired wafer number and a desired wafer address by reading ID information about each semiconductor chip without the need for the tray storing part 8 to manage storage information. In this case, a semiconductor chip can be stored into a tray again.

If ID information is made of an A1 pattern, the ID information can be formed simultaneously with process of forming a surface electrode of a semiconductor chip by using A1. This makes it possible to form the ID information without involving increase of manufacturing steps.

If ID information is formed on a passivation film of a semiconductor chip, the ID information can be read easily and formation of the ID information exerts less influence on electrical characteristics.

If ID information is formed of a two-dimensional bar code, many pieces of information can be written. Specifically, different process information such as the position of a wafer in a lot can be written in addition to a wafer address.

Figure 11:
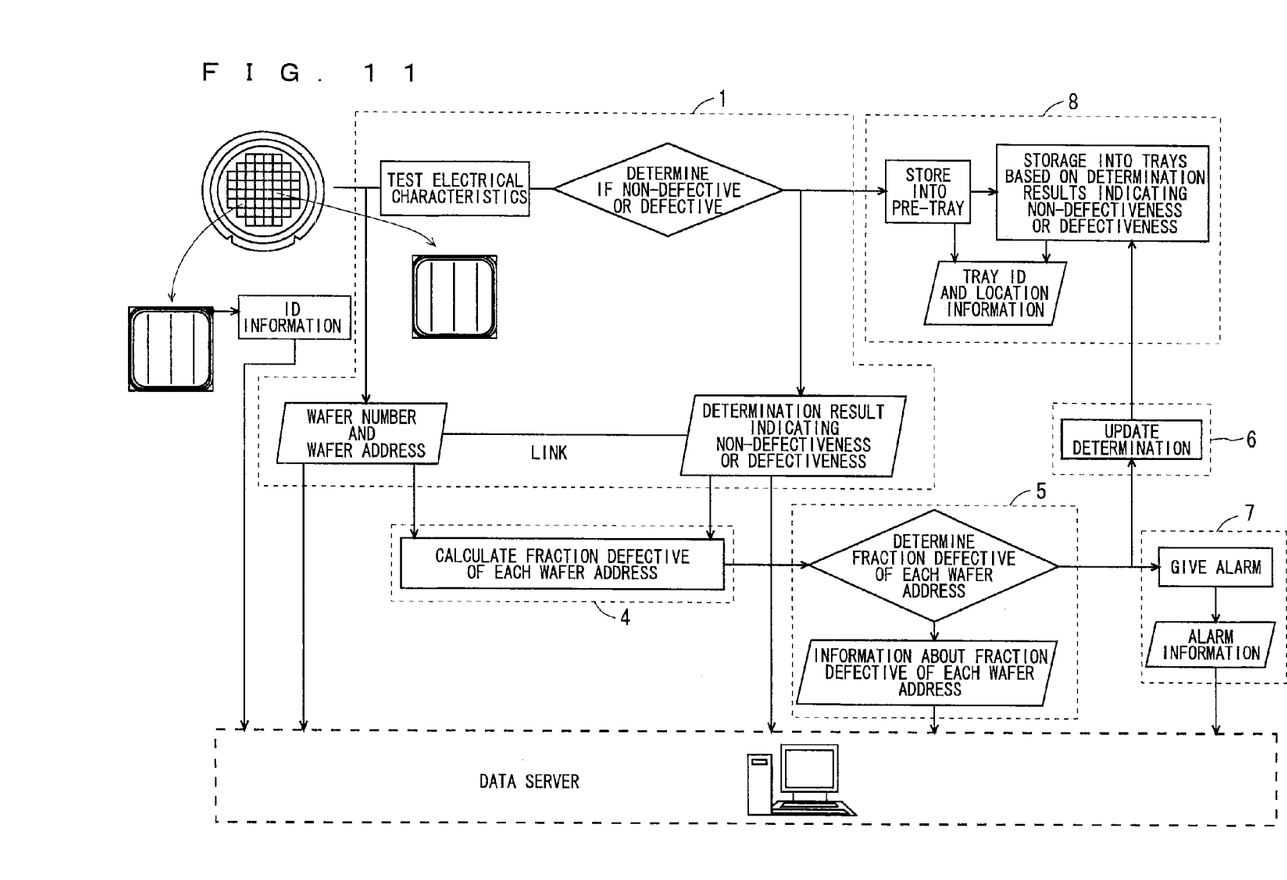
FIG. 11 explains the structure of a semiconductor chip testing device of a modification of the second preferred embodiment in consideration of the operation thereof.

In the description given above, information is transmitted between the components of the semiconductor chip testing device 11. Meanwhile, a data server to manage the information in a centralized manner may be provided, and each of the components may be put into operation by transferring information to and from the data server as shown in FIG. 11. Examples of the information managed in a centralized manner by the data server include a determination result and determination data output from the determining part 1, a fraction defective of each wafer address output from the fraction defective calculating part 4, a determination result about a fraction defective of each wafer address output from the fraction defective determining part 5, and storage information managed by the tray storing part 8. If these pieces of information are managed in association with each other and in a centralized manner by the data server, data can be managed and extracted easily.

Effects

A semiconductor chip testing method of the second preferred embodiment includes a step (g) performed after the step (a). In the step (g), each of the semiconductor chips is stored into a tray if the semiconductor chips are tested in the form of chips. So, the semiconductor chips can be placed on standby in the tray waiting for completion of calculation of a fraction defective of each wafer address.

In the semiconductor chip testing method of the second preferred embodiment, the step (g) includes the steps of: (g1) storing the semiconductor chips into the tray (pre-tray) in the order in which the semiconductor chips are determined to be non-defective or defective; and (g2) storing the semiconductor chips into the tray (non-defective or defective tray) again based on the determination results about the semiconductor chips. The step (g2) is performed after the steps (g1) and (c). This makes it possible to use only a semiconductor chip of high reliability and determined to be non-defective for assembly of a semiconductor element.

In the semiconductor chip testing method of the second preferred embodiment, the semiconductor chips are stored into the tray (pre-tray, non-defective tray or defective tray) given a tray ID in the step (g). So, if determination data about an arbitrary semiconductor chip, a tray ID of a tray in which the semiconductor chip is stored and location information about the semiconductor chip are associated with each other and managed as storage information about the semiconductor chip, information unique to a semiconductor chip in the tray can be known without the need of directly writing information onto the chip.

The semiconductor chip testing method of the second preferred embodiment further includes a step (i) performed before the step (a). In the step (i), ID information containing the wafer addresses is made recognizable on the semiconductor chips, and the ID information is written on the semiconductor chips. This makes it possible to search for a semiconductor chip having a desired wafer number and a desired wafer address by reading ID information about each semiconductor chip without the need for the tray storing part 8 to manage storage information. So, a semiconductor chip can be stored into a tray again.

In the semiconductor chip testing method of the second preferred embodiment, if the ID information is formed of an A1 pattern in the step (i), the ID information can be formed simultaneously with process of forming a surface electrode of a semiconductor chip by using A1. This makes it possible to form the ID information without involving increase of manufacturing steps.

In the semiconductor chip testing method of the second preferred embodiment, if the ID information is written on a passivation film of the semiconductor chips in the step (i), the ID information can be read easily and formation of the ID information exerts less influence on electrical characteristics.

In the semiconductor chip testing method of the second preferred embodiment, if the ID information is formed of a two-dimensional bar code in the step (i), many pieces of information can be written. Specifically, different process information such as the position of a wafer in a lot can be written in addition to a wafer address.

In the semiconductor chip testing device of the second preferred embodiment, the determining part 1 tests the electrical characteristics of the semiconductor chips in the form of chips. The semiconductor chip testing device further includes the tray storing part 8 for storing each of the semiconductor chips into a tray after the determining part 1 makes determinations about the semiconductor chips. So, the semiconductor chips can be placed on standby in the tray waiting for completion of calculation and determination of a fraction defective of each wafer address by the fraction defective calculating part 4.

In the semiconductor chip testing device of the second preferred embodiment, the tray storing part 8 stores the semiconductor chips determined by the determining part 1 into different trays based on condition of update made by the determination updating part 6 and based on determination results about the semiconductor chips. This makes it possible to use only a semiconductor chip of high reliability and determined to be non-defective for assembly of a semiconductor element.

Further, in the semiconductor chip testing device of the second preferred embodiment, the tray storing part 8 stores the semiconductor chips into a tray given a tray ID. So, if determination data about an arbitrary semiconductor chip, a tray ID of a tray in which the semiconductor chip is stored, and location information about the semiconductor chip are associated with each other and managed as storage information about the semiconductor chip, information peculiar to a semiconductor chip in the tray can be known without the need of directly writing information into the chip.

In the semiconductor chip testing device of the second preferred embodiment, if a semiconductor chip to be used is given ID information written on the semiconductor chip that contains a wafer address and made recognizable on the semiconductor chip, a semiconductor chip having a desired wafer number and a desired wafer address can be searched for by reading ID information about each semiconductor chip without the need for the tray storing part to manage storage information. So, a semiconductor chip can be stored into a tray again.

In the semiconductor chip testing device of the second preferred embodiment, if a semiconductor chip to be used is given ID information formed on a passivation film of the semiconductor chip, the ID information can be read easily and formation of the ID information exerts less influence on electrical characteristics.

In addition, in the semiconductor chip testing device of the second preferred embodiment, if a semiconductor chip to be used is given ID information formed of a two-dimensional bar code, many pieces of process information including the position of a wafer in a lot as well as a wafer address can be written as the ID information.

While the invention has been shown and described in detail, the foregoing description is in all aspects illustrative and not restrictive. It is therefore understood that numerous modifications and variations can be devised without departing from the scope of the invention.

What is claimed is:

1. A semiconductor chip testing method comprising the steps of:
   (a) testing the electrical characteristics of each semiconductor chip of a plurality of semiconductor chips formed on a predetermined number of wafers, wherein each wafer of the predetermined number of wafers includes a same number of semiconductor chips located at same positions within each wafer, and each semiconductor chip of each wafer having a wafer address corresponding to the respective position on the respective wafer;
   (b) determining by a processor whether each semiconductor chip is non-defective or defective according to the tested electrical characteristics;
   (c) automatically calculating, by the processor, for each individual wafer address, a percentage of semiconductor chips that are defective at each individual wafer address according to the determination of the processor;
   (d) automatically changing, by the processor, a determination result about a semiconductor chip determined in step (b) as non-defective to defective when the semiconductor chip is located at a wafer address at which the percentage calculated in step (c) is equal to or greater than a predetermined threshold thereby to increase semiconductor chip reliability; and
   (e) storing, when said semiconductor chips are tested in the form of chips, each of said semiconductor chips into a tray in the order in which said semiconductor chips are determined, and storing said semiconductor chips into said tray again based on said determination results about said semiconductor chips.

2. The semiconductor chip testing method according to claim 1, wherein said step (a) includes testing the electrical characteristics of said semiconductor chips on said wafers formed in one manufacturing device or belonging to one ingot.

3. The semiconductor chip testing method according to claim 2, further comprising the step of:
   (f) generating an alarm when any one of said wafer addresses has a percentage calculated in step (c) that is equal to or greater than the predetermined threshold.

4. The semiconductor chip testing method according to claim 2, further comprising the step of:
   (g) marking information that indicates a defectiveness of a particular semiconductor chip on said semiconductor chip, the defectiveness determined in said steps (b) and (c).

5. The semiconductor chip testing method according to claim 2, further comprising the step of:
   (h) storing said predetermined number of wafers into a cassette when said semiconductor chips are tested in the form of wafers.

6. The semiconductor chip testing method according to claim 1 wherein in said step (e), said semiconductor chips are stored into said tray given a tray ID.

7. The semiconductor chip testing method according to claim 1 further comprising the step of:
   (i) applying ID information containing said wafer addresses that are recognizable on said semiconductor chips, and writing said ID information on said semiconductor chips, the step (i) being performed before said step (a).

8. The semiconductor chip testing method according to claim 7, wherein in said step (i), said ID information is formed of an A1 pattern.

9. The semiconductor chip testing method according to claim 7, wherein in said step (i), said ID information is written on a passivation film of said semiconductor chips.

10. The semiconductor chip testing method according to claim 7, wherein in said step (i), said ID information is formed of a two-dimensional bar code.

11. A semiconductor chip testing device, comprising:
   a testing part that tests the electrical characteristics of each of semiconductor chips formed on a predetermined number of wafers, wherein each wafer of the predetermined number of wafers includes a same number of semiconductor chips located at same positions within each wafer and each semiconductor chip of each wafer having a wafer address corresponding to the respective position on the respective wafer; and
   a processor configured to
      determine whether each semiconductor chip is non-defective or defective according to the tested electrical characteristics;
      automatically calculate, for each individual wafer address, a percentage of semiconductor chips that are defective at each individual wafer address according to the determination;
      automatically change a determination result about a semiconductor chip determined as non-defective to defective when the semiconductor chip is located at a wafer address at which the percentage calculated is equal to or greater than a predetermined threshold thereby to increase semiconductor chip reliability; and
      store, when said semiconductor chips are tested in the form of chips, each of said semiconductor chips into a tray in the order in which said semiconductor chips are determined, and store said semiconductor chips into said tray again based on said determination results about said semiconductor chips.

12. The semiconductor chip testing device according to claim 11, wherein said wafers are formed in one manufacturing device or said wafers belong to one ingot.

13. The semiconductor chip testing device according to claim 12, wherein the processor is further configured to generate an alarm when any one of said wafer addresses has a percentage calculated that is equal to or greater than the predetermined threshold.

14. The semiconductor chip testing device according to claim 12, further comprising a marking part that marks a particular semiconductor chip with information that indicates a defectiveness on said particular semiconductor chip, the defectiveness determined by the processor.

15. The semiconductor chip testing device according to claim 12, further comprising a cassette storing part that stores said wafers in a cassette in units of said predetermined number.

16. The semiconductor chip testing device according to claim 12, further comprising a data server that centrally manages information about the semiconductor chips, wherein
the information is output to the data server the processor.

17. The semiconductor chip testing device according to claim 11, wherein said tray is given a tray ID.

18. The semiconductor chip testing device according to claim 11, wherein ID information containing said wafer addresses is applied onto said semiconductor chips.

19. The semiconductor chip testing device according to claim 18, wherein said ID information is formed on a passivation film of said semiconductor chips.

20. The semiconductor chip testing device according to claim 18, wherein said ID information is formed of a two-dimensional bar code.

* * * * *